United States Patent
Kang et al.

(10) Patent No.: US 8,288,873 B2
(45) Date of Patent: Oct. 16, 2012

(54) STACK PACKAGE HAVING FLEXIBLE CONDUCTORS

(75) Inventors: Tae Min Kang, Seoul (KR); You Kyung Hwang, Seoul (KR); Jae-hyun Son, Gyeonggi-do (KR); Dae Woong Lee, Gyeonggi-do (KR); Byoung Do Lee, Gyeonggi-do (KR); Yu Hwan Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 164 days.

(21) Appl. No.: 12/837,879

(22) Filed: Jul. 16, 2010

(65) Prior Publication Data

US 2011/0254167 A1      Oct. 20, 2011

(30) Foreign Application Priority Data

Apr. 14, 2010   (KR) .................. 10-2010-0034400

(51) Int. Cl.
*H01L 23/485* (2006.01)
(52) U.S. Cl. ......... 257/777; 257/E23.023; 257/E23.024; 257/E23.124
(58) Field of Classification Search ........... 257/E23.023, 257/E23.024, E23.124, 777
See application file for complete search history.

(56) References Cited

U.S. PATENT DOCUMENTS

| | | | | |
|---|---|---|---|---|
| 6,376,769 B1 * | 4/2002 | Chung | .................... | 174/524 |
| 7,167,373 B1 * | 1/2007 | Hoang et al. | .................. | 361/749 |
| 7,453,157 B2 * | 11/2008 | Haba et al. | ..................... | 257/785 |
| 7,675,164 B2 * | 3/2010 | Bartley et al. | ................. | 257/718 |
| 8,004,093 B2 * | 8/2011 | Oh et al. | ........................ | 257/783 |
| 2002/0117330 A1 * | 8/2002 | Eldridge et al. | ............. | 174/260 |
| 2002/0139577 A1 * | 10/2002 | Miller | ........................... | 174/261 |
| 2006/0186540 A1 | 8/2006 | Buchwalter et al. | | |
| 2008/0036063 A1 * | 2/2008 | Kim | ............................... | 257/686 |
| 2008/0122113 A1 * | 5/2008 | Corisis et al. | ................. | 257/777 |
| 2008/0157321 A1 * | 7/2008 | Camacho et al. | ............ | 257/686 |
| 2008/0315396 A1 | 12/2008 | Kuhlman et al. | | |
| 2009/0309197 A1 * | 12/2009 | Chow et al. | .................... | 257/659 |
| 2010/0091537 A1 * | 4/2010 | Best et al. | ........................ | 365/51 |
| 2010/0224978 A1 * | 9/2010 | Shim et al. | ..................... | 257/686 |
| 2011/0104828 A1 * | 5/2011 | Balucani | ........................... | 438/3 |

FOREIGN PATENT DOCUMENTS

| | | | |
|---|---|---|---|
| KR | 1020080058929 A | 6/2008 | |
| KR | 1020100113676 A | 10/2010 | |

* cited by examiner

*Primary Examiner* — George Fourson, III
(74) *Attorney, Agent, or Firm* — Ladas & Parry LLP (57) ABSTRACT

A stack package includes a first package having a first semiconductor chip and a first encapsulation member which seals the first semiconductor chip. A second package is stacked on the first package, and includes a second semiconductor chip and a second encapsulation member which seals the second semiconductor chip. Flexible conductors are disposed within the first encapsulation member of the first package in such a way as to electrically connect the first package and the second package.

16 Claims, 4 Drawing Sheets

STACK PACKAGE HAVING FLEXIBLE CONDUCTORS

CROSS-REFERENCE TO RELATED APPLICATIONS

The present application claims priority to Korean patent application number 10-2010-0034400 filed on Apr. 14, 2010, which is incorporated herein by reference in its entirety.

BACKGROUND OF THE INVENTION

The present invention relates generally to a stack package, and more particularly, to a stack package which can substantially prevent the occurrence of cracks due to a difference in coefficient of thermal expansion between component parts.

Recently, a semiconductor package having a memory semiconductor chip capable of storing and processing a huge amount of data within a short time has been developed. Also, a stack package has been developed, in which a plurality of memory semiconductor chips are stacked at a chip level or a package level to increase data storage capacity. A package-on-package (POP) is a representative example of a stack package which is constructed by stacking memory semiconductor chips at a package level.

Further recent developments include a system-in-package (SIP), in which memory semiconductor chips and a system semiconductor chip are stacked to improve data storage capacity and data processing speed. Typically, such a system-in-package is constructed by stacking the memory semiconductor chips and the system semiconductor chip at a chip level. As the case may be, the system-in-package may be constructed by stacking the memory semiconductor chips and the system semiconductor chip at a package level.

Conventional stack packages are constructed by vertically stacking semiconductor packages. However such vertically stacked semiconductor packages are problematic because cracks can occur due to a difference in coefficient of thermal expansion between component parts, thus reducing the reliability of such packages.

In detail, in the conventional stack packages, an electrical connection between a first package and a second package is accomplished by forming pre-solders or copper posts in the first package. In such a conventional stack package structure, due to a mismatch in coefficient of thermal expansion (CTE) between an epoxy molding compound (EMC) provided as an encapsulation member for sealing a semiconductor chip, and the pre-solders or the copper posts formed in the first package for electrical connection between the first package and the second package, warpage and cracks can occur in the first package, whereby the reliability of the stack packages can be degraded.

BRIEF SUMMARY OF THE INVENTION

An embodiment of the present invention includes a stack package which can substantially prevent the occurrence of warpage due to a mismatch in coefficient of thermal expansion between component parts.

Also, an embodiment of the present invention includes a stack package which can suppress the occurrence of cracks due to a mismatch in coefficient of thermal expansion between component parts.

Further, an embodiment of the present invention includes a stack package which can improve the reliability thereof by reducing the occurrence of warpage and cracks due to a mismatch in coefficient of thermal expansion between component parts.

In an embodiment of the present invention, a stack package includes: a first package having a first semiconductor chip and a first encapsulation member which seals the first semiconductor chip; a second package stacked on the first package, and having a second semiconductor chip and a second encapsulation member which seals the second semiconductor chip; and flexible conductors disposed in the first encapsulation member of the first package in such a way as to electrically connect the first package and the second package.

Each of the flexible conductors may have a configuration in which a flexible circuit board formed with copper patterns on one surface thereof is rolled up in the shape of a hollow cylinder such that the copper patterns are disposed outside, or a configuration in which a flexible circuit board formed with copper patterns on one surface thereof has a sectional shape alternately curved in opposite directions.

The first encapsulation member may have holes into which the respective flexible conductors are inserted.

The stack package may further include underfills formed in the holes of the first encapsulation member into which the flexible conductors are inserted.

The stack package may further include first coupling members attached to a lower surface of the first package.

The stack package may further include second coupling members attached to a lower surface of the second package and electrically connected with the flexible conductors.

The second coupling members may include solder balls or other flexible conductors.

In an embodiment of the present invention, a stack package includes: a first package including a first substrate having an upper surface on which first bond fingers and connection pads are disposed and a lower surface on which first ball lands are disposed, a first semiconductor chip disposed on the upper surface of the first substrate and having first bonding pads which are electrically connected with the first bond fingers, and a first encapsulation member formed on the upper surface of the first substrate in such a way as to seal the first semiconductor chip; a second package stacked on the first package and including a second substrate having an upper surface on which second bond fingers are disposed and a lower surface on which second ball lands are disposed, a second semiconductor chip disposed on the upper surface of the second substrate and having second bonding pads which are electrically connected with the second bond fingers, and a second encapsulation member formed on the upper surface of the second substrate in such a way as to seal the second semiconductor chip; and flexible conductors disposed in the first encapsulation to member of the first package in such a way as to electrically connect the first package and the second package.

The stack package may further include first coupling members attached to the first ball lands.

The flexible conductors may have one ends which are exposed out of the first encapsulation member and are directly connected to the second ball lands.

The stack package may further include second coupling members attached to the second ball lands and connected with the flexible conductors disposed in the first encapsulation member.

The flexible conductors may have one ends which are exposed out of the first encapsulation member and are connected to the second coupling members.

The second coupling members may include solder balls or other flexible conductors.

Each of the flexible conductors may have a configuration in which a flexible circuit board formed with copper patterns on one surface thereof is rolled up in the shape of a hollow cylinder such that the copper patterns are disposed outside, or a configuration in which a flexible circuit board formed with copper patterns on one surface thereof has a sectional shape alternately curved in opposite directions.

The first encapsulation member may have holes which respectively expose the connection pads and into which the respective flexible conductors are inserted.

The stack package may further include underfills formed in the holes of the first encapsulation member into which the flexible conductors are inserted.

The first encapsulation member may have holes each of which simultaneously exposes a pair of adjoining connection pads and into which the respective flexible conductors are inserted.

Each of the flexible conductors may include a flexible circuit board which has one surface and the other surface facing away from the one surface and copper patterns which are formed on the one surface of the flexible circuit board, and may have a configuration in which the copper patterns are disposed separately on both sidewalls of the holes while having a U-like sectional shape.

The stack package may further include underfills formed in the holes of the first encapsulation member into which the flexible conductors are inserted.

The first semiconductor chip having the first bonding pads and the second semiconductor chip having the second bonding pads may be respectively disposed in a face-up type on an upper surface of the first substrate on which the first bond fingers are disposed and on an upper surface of the second substrate on which the second bond fingers are disposed.

The stack package may further include connection members which electrically connect the first bonding pads of the first semiconductor chip and the first bond fingers of the first substrate with each other and the second bonding pads of the second semiconductor chip and the second bond fingers of the second substrate with each other.

The connection members may include conductive wires or pattern films.

The first semiconductor chip having the first bonding pads and the second semiconductor chip having the second bonding pads may be respectively disposed in a face-down type on an upper surface of the first substrate on which the first bond fingers are disposed and on an upper surface of the second substrate on which the second bond fingers are disposed.

The stack package may further include connection members which electrically connect the first bonding pads of the first semiconductor chip and the first bond fingers of the first substrate with each other and the second bonding pads of the second semiconductor chip and the second bond fingers of the second substrate with each other.

The connection members may include bumps or solders.

In an embodiment of the present invention, a stack package include: a first package having a first semiconductor chip and a first encapsulation member which seals the first semiconductor chip; one or more second packages stacked on the first package, and having second semiconductor chips and second encapsulation members which seal the second semiconductor chips; and flexible conductors respectively disposed in the first encapsulation member of the first package and in the second encapsulation members of the second packages which remain by excluding an uppermost second package among the stacked second packages, in such a way as to electrically connect the first package and the second package with each other and the second packages with each other.

Each of the flexible conductors may have a configuration in which a flexible circuit board formed with copper patterns on one surface thereof is rolled up in the shape of a hollow cylinder such that the copper patterns are disposed outside, or a configuration in which a flexible circuit board formed with copper patterns on one surface thereof has a sectional shape alternately curved in opposite directions.

The stack package may further include first coupling members attached to a lower surface of the first package; and second coupling members attached to lower surfaces of the second packages and electrically connected with the flexible conductors.

The second coupling members may include solder balls or other flexible conductors.

DESCRIPTION OF SPECIFIC EMBODIMENTS

Hereafter, specific embodiments of the present invention will be described in detail with reference to the accompanying drawings.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

Figure 1:
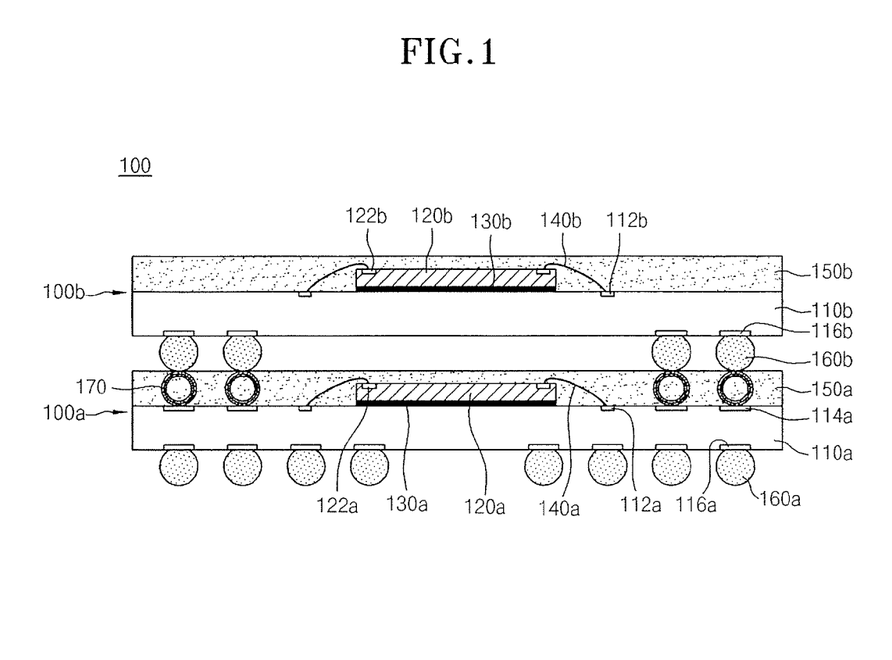
FIG. 1 is a cross-sectional view showing a stack package in accordance with an embodiment of the present invention.

FIG. 1 is a cross-sectional view showing a stack package in accordance with an embodiment of the present invention. Referring to FIG. 1, a stack package 100 in accordance with an embodiment of the present invention includes a first package 100a, and a second package 100b which is stacked on the first package 100a.

The first package 100a includes a first substrate 110a, a first semiconductor chip 120a which is disposed on the first substrate 110a, a first encapsulation member 150a which seals the first semiconductor chip 120a, and flexible conductors 170 which are disposed in the first encapsulation member 150a.

The first substrate 110a may be, for example, a printed circuit board, although the first substrate 110a is not limited thereto. The first substrate 110a has first bond fingers 112a and connection pads 114a which are disposed on the upper surface of the first substrate 110a and first ball lands 116a which are disposed on the lower surface of the first substrate 110a opposite the upper surface. The first semiconductor chip 120a includes, for example, an edge pad type chip. The first semiconductor chip 120a is attached in a face-up type to the upper surface of the first substrate 110a by a first adhesive member 130a.

The first package 100a further includes first connection members 140a which connect first bonding pads 122a of the first semiconductor chip 120a and the first bond fingers 112a of the first substrate 110a which are disposed adjacent to the first bonding pads 122a, respectively. The first connection members 140a can include conductive wires as shown in the drawing, although it should be understood that the present invention is not limited in this regard. For example, although not shown in a drawing, pattern films having circuit patterns can be used as the first connection members 140a.

The first package 100a may further include first coupling members 160a which are respectively attached to the first ball lands 116a disposed on the lower surface of the first substrate 110a. The first coupling members 160a can include solder balls as shown in the drawing.

The first encapsulation member 150a is formed to cover the upper surface of the first substrate 110a including the first semiconductor chip 120a and the first connection members 140a. As the first encapsulation member 150a, for example, an epoxy molding compound (EMC) can be used.

Figure 2:
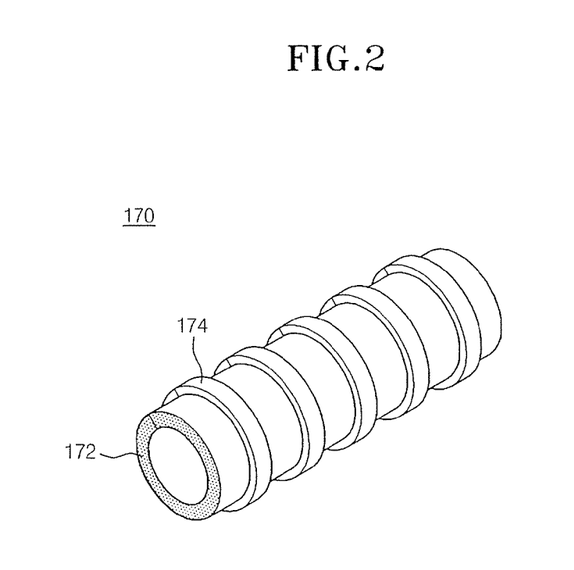
FIGS. 2 and 3 are perspective views showing flexible conductors which are used in stack packages in accordance with embodiments of the present invention.

The flexible conductors 170 are disposed in the first encapsulation member 150a of the first package 100a. According to an embodiment of the present invention, as shown in FIG. 2, each flexible conductor 170 includes an insulative flexible circuit board 172 and copper patterns 174 which are formed on one surface of the flexible circuit board 172. As shown in FIG. 2, each flexible conductor 170 has a configuration in which the flexible circuit board 172 having the copper patterns 174 formed on the one surface thereof is rolled up in the shape of a hollow cylinder such that the copper patterns 174 are disposed outside around the circumference of the cylinder. Both sides of the flexible circuit board 172 are attached to each other, for example, by means of an adhesive (not shown in detail).

Figure 3:
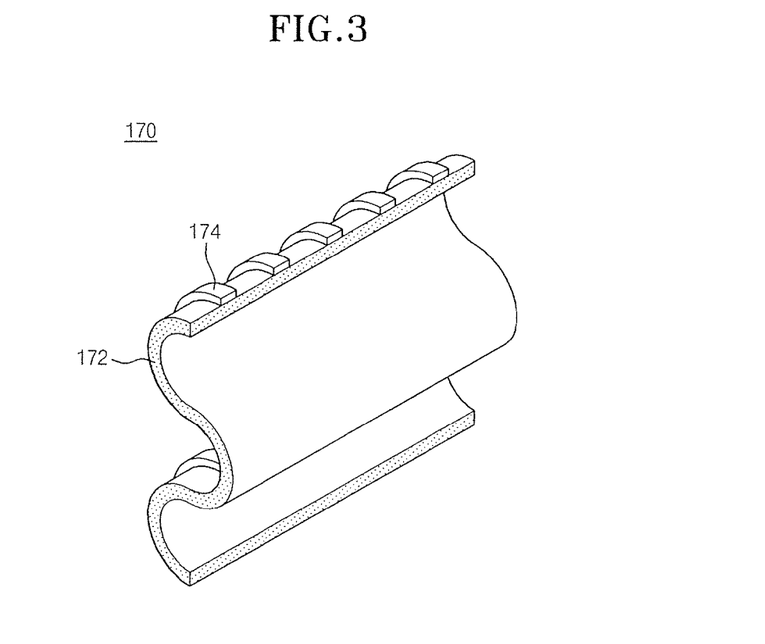

According to an embodiment, the flexible conductor 170 may have a configuration in which the flexible circuit board 172 formed with the copper patterns 174 on the one surface thereof has a cross-sectional shape alternately curved in opposite directions as shown in FIG. 3. The structure of the alternately curving flexible conductor 170 is such that the copper patterns 174 are disposed on the upper end and the lower end of the flexible circuit board 172, such that the copper patterns 174 are located at points of contact at the upper and lower ends of the flexible circuit boards 172.

As shown in FIG. 1, in the flexible conductors 170, the lower ends of the copper patterns 174 are connected with the connection pads 114a of the first substrate 110a, and the upper ends of the copper patterns 174 are exposed out of the surface of the first encapsulation member 150a.

According to an embodiment, the flexible conductors 170 can be disposed on the connection pads 114a of the first substrate 110a before forming the first encapsulation member 150a. Then the first encapsulation member 150a is formed, for example, to a thickness that exposes the upper ends of the flexible conductors 170. Alternatively, the first encapsulation member 150a is formed to a thickness that completely covers the flexible conductors 170 and is then the thickness of the first encapsulation member 170 is reduced, for example by implementing a grinding such that the upper ends of the flexible conductors 170 are exposed.

While not shown in detail, it is conceivable that the first encapsulation member 150a may be formed on the first substrate 110a having the flexible conductors 170 disposed thereon to a thickness that completely covers the flexible conductors 170, and may then be selectively etched such that the upper ends of the flexible conductors 170 are simultaneously exposed.

The second package 100b includes a second substrate 110b, a second semiconductor chip 120b which is disposed on the second substrate 110b, and a second encapsulation member 150b which seals the second semiconductor chip 120b.

The second substrate 110b may be realized as a printed circuit board, although the present invention is not limited in this way. The second substrate 110b has second bond fingers 112b which are disposed on the upper surface of the second substrate 110b and second ball lands 116b which are disposed on the lower surface of the second substrate 110b. The second semiconductor chip 120b may comprise, for example, an edge pad type chip. The second semiconductor chip 120b is attached in a face-up type to the upper surface of the second substrate 110b by a second adhesive member 130b.

The second package 100b further includes second connection members 140b which electrically connect second bonding pads 122b of the second semiconductor chip 120b and the second bond fingers 112b of the second substrate 110b which are disposed adjacent to the second bonding pads 122b, respectively. The second connection members 140b can include, for example, conductive wires. Although not shown in a drawing, pattern films having circuit patterns can be used as the second connection members 140b.

The second package 100b may further include second coupling members 160b which are respectively attached to the second ball lands 116b disposed on the lower surface of the second substrate 110b. The second coupling members 160b can include, for example, solder balls. Also, as the second coupling members 160b, other flexible conductors, which have the same or a similar structure as the flexible conductors 170 inserted into the first encapsulation member 150a, may be used.

According to an embodiment, the second coupling members 160b are electrically connected with the flexible conductors 170 which are exposed out of the surface of the first encapsulation member 150a of the first package 100a. In detail, the second coupling members 160b are electrically connected with the copper patterns 172 which are disposed on the upper ends of the flexible conductors 170 and are exposed out of the surface of the first encapsulation member 150a, in such a way as to electrically connect the second package 100b and the first package 100a with each other.

The second encapsulation member 150b is formed to cover the upper surface of the second substrate 110b including the second semiconductor chip 120b and the second connection members 140b. As the second encapsulation member 150b, for example, an EMC can be used.

In the above-described stack package 100 in accordance with an embodiment of the present invention, the second package 100b can be constructed without attaching the second coupling members 160b to the second ball lands 116b. In this case, the flexible conductors 170, which are exposed out of the surface of the first encapsulation members 150a of the first package 100a, are directly connected to the second ball lands 116b of the second package 100b.

The stack package in accordance with an embodiment of the present invention, constructed as mentioned above, has a package-on-package (POP) structure in which electrical connection between a first package and a second package is realized by inserting flexible conductors into the first package. Accordingly, in the stack package according to an embodiment of the present invention, when compared to a conventional stack package which is constructed by inserting pre-solders or copper posts in a first package, mismatch in coefficient of thermal expansion (CTE) between component parts can be decreased, whereby the occurrence of warpage of the first package is reduced and the occurrence of cracks is suppressed.

For example, in the stack package according to an embodiment of the present invention, since mismatch between an EMC as the material of a first encapsulation member and a solder or between the EMC and a copper post in the conventional art is considerably decreased, warpage may be reduced by 50% or more when compared to the conventional art. Also, because the flexible conductors reduce stress resulting from the mismatch between the EMC and the solder or between the EMC and the copper post, the occurrence of cracks is reduced by about 20~50% when compared to the conventional art.

Thus, in the stack package according to the first embodiment of the present invention, the occurrence of warpage and cracks due to mismatch in CTE between component parts is reduced considerably, whereby the reliability of a stack package according to an embodiment of the present invention is improved.

Figure 4:
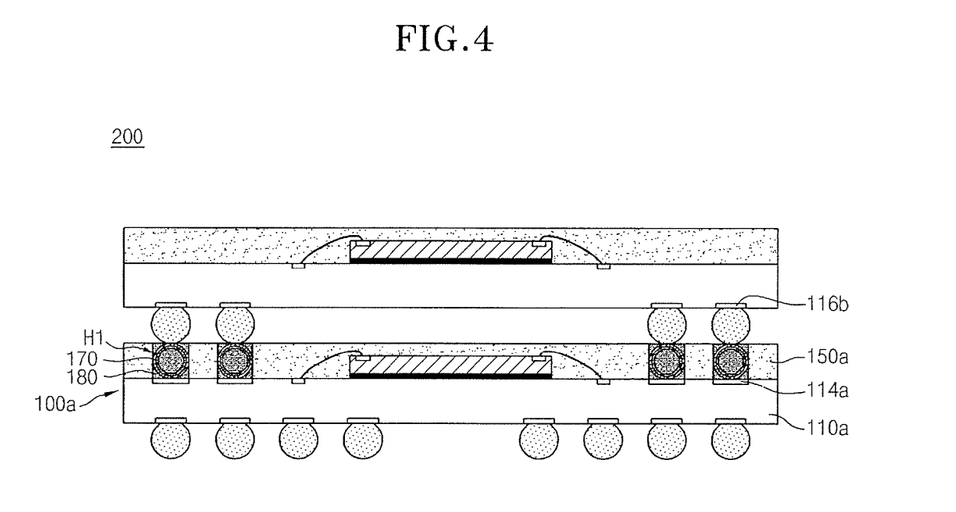
FIG. 4 is a cross-sectional view showing a stack package in accordance with an embodiment of the present invention.

FIG. 4 is a cross-sectional view showing a stack package in accordance with an embodiment of the present invention. The same reference numerals as in FIG. 1 will be used to refer to the same or like parts.

Referring to FIG. 4, holes H1 are defined in the first encapsulation member 150a of the first package 100a in such a way as to respectively expose connection pads 114a which are disposed on the upper surface of the first substrate 110a. Flexible conductors 170 are respectively inserted into the holes H1 and are disposed to be respectively connected with the corresponding connection pads 114a. Underfills 180 are formed in the holes H1 into which the flexible conductors 170 are inserted. The holes H1 can be understood as being defined through, for example, a drilling process or an etching process after the first encapsulation member 150a is formed.

The flexible conductors 170 are disposed to have, for example, a circular sectional shape as shown in FIG. 2, and the underfills 180 are formed in the flexible conductors 170 as well. In addition to the circular sectional shape, while not shown in a drawing, the flexible conductors 170 may have a sectional shape alternately curved in opposite directions as shown in FIG. 3.

Since the other component parts of the stack package 200 in accordance with an embodiment of the present invention as shown in FIG. 4 are the same as those of the stack package 100 depicted in FIG. 1, repeated descriptions thereof will be omitted herein.

Figure 5:
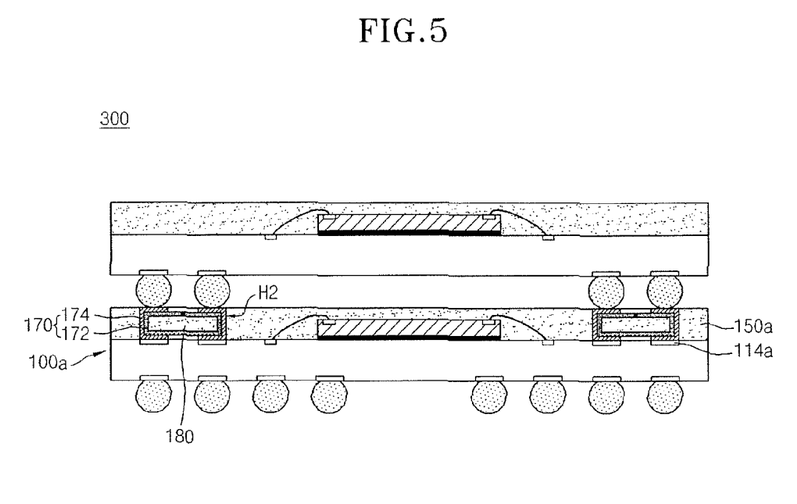
FIG. 5 is a cross-sectional view showing a stack package in accordance with an embodiment of the present invention.

FIG. 5 is a cross-sectional view showing a stack package in accordance with an embodiment of the present invention. The same reference numerals as in FIG. 1 will be used to refer to the same or like parts.

Referring to FIG. 5, holes H2 are defined in the first encapsulation member 150a of the first package 100a in such a manner that each hole H2 exposes a pair of adjoining connection pads 114a, and flexible conductors 170 are inserted into the holes H2. Underfills 180 are formed in the holes H2 into which the flexible conductors 170 are inserted. The underfills 180 are formed in the flexible conductors 170 as well.

In the present embodiment, the flexible conductors 170 are disposed in such a manner that copper patterns 174 which are formed on one surface of the flexible circuit boards 172 are disposed separately on both sidewalls of the holes H2 while having a U-like sectional shape.

Since the other component parts of the stack package 300 in accordance with an embodiment of the present invention as shown in FIG. 5 are the same as those of the stack package 100 depicted in FIG. 1, repeated descriptions thereof will be omitted herein.

Figure 6:
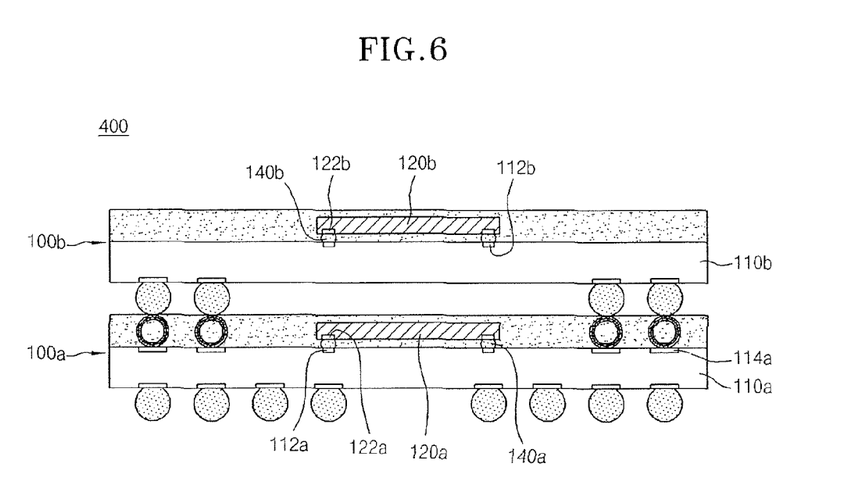
FIG. 6 is a cross-sectional view showing a stack package in accordance with an embodiment of the present invention.

FIG. 6 is a cross-sectional view showing a stack package in accordance with an embodiment of the present invention. The same reference numerals as in FIG. 1 will be used to refer to the same or like parts.

Referring to FIG. 6, a first semiconductor chip 120a of a first package 100a and a second semiconductor chip 120b of a second package 100b are disposed in a face-down type on a first substrate 110a and a second substrate 110b, respectively, flip chip bonding as opposed to wire bonding.

First bond fingers 112a of the first substrate 110a and second bond fingers 112b of the second substrate 110b are disposed at positions corresponding to first bonding pads 122a of the first semiconductor chip 120a and second bonding pads 122b of the second semiconductor chip 120b. The first bonding pads 122a of the first semiconductor chip 120a and the first bond fingers 112a of the first substrate 110a are electrically connected with each other by means of first connection members 140a, for example, bumps. The second bonding pads 122b of the second semiconductor chip 120b and the second bond fingers 112b of the second substrate 110b are electrically connected with each other by means of second connection members 140b, for example, bumps. In addition to bumps, solders or the like can be used as the first and second connection members 140a and 140b.

Since the other component parts of the stack package 400 in accordance with an embodiment of the present invention as shown in FIG. 6 are the same as those of the stack package 100 depicted in FIG. 1, repeated descriptions thereof will be omitted herein.

Figure 7:
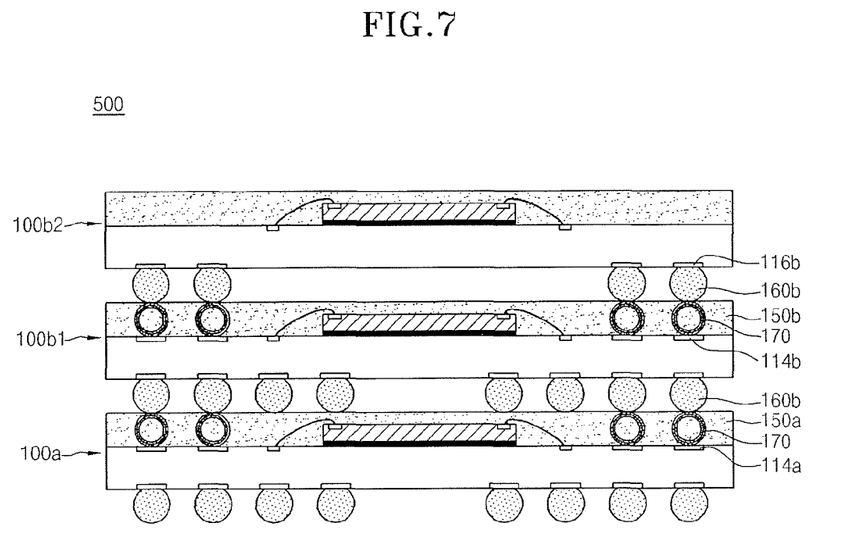
FIG. 7 is a cross-sectional view showing a stack package in accordance with an embodiment of the present invention.

FIG. 7 is a cross-sectional view showing a stack package in accordance with an embodiment of the present invention. The same reference numerals as in FIG. 1 will be used to refer to the same or like parts.

According to embodiments of the present invention, two or more second packages can be stacked on a first package. For example, referring to FIG. 7 two second packages 100b1 and 100b2 are stacked on a first package 100a. The uppermost second package 100b2 of the stacked second packages 100b1 and 100b2, has the same structure described above with regard to the second package 100b. The remaining second package 100b1 which is disposed under the uppermost second package 100b2 has the same structure as the first package 100a, that is, a structure in which flexible conductors 170 are disposed in a second encapsulation member 150b so as to be electrically connected with the second package 100b2 disposed thereon.

As described above, the flexible conductor 170 has a configuration in which a flexible circuit board formed with copper patterns on one surface thereof is rolled up in the shape of a hollow cylinder such that the copper patterns are disposed on an external surface thereof. While not shown in a drawing, the flexible conductor 170 may have a configuration in which a flexible circuit board formed with copper patterns on one surface thereof has a sectional shape alternately curved in opposite directions as depicted in FIG. 3.

In the present embodiment, the flexible conductors 170 are disposed in the first package 100a and in the second package 100b1. The flexible conductors 170 electrically connect the first package 100a and the second package 100b1 with each other and electrically connect the second packages 100b1 and 100b2 with each other.

One ends of the flexible conductors 170 are connected with corresponding connection pads 114a and 114b, and the other ends of the flexible conductors 170, which face away from the one ends and are exposed out of the surface of encapsulation members 150a and 150b, are electrically connected with second coupling members 160b of the second packages 100b1 and 100b2.

Since the other component parts of the stack package 500 in accordance with an embodiment of the present invention as shown in FIG. 7 are the same as those of the stack package 100 depicted in FIG. 1, repeated descriptions thereof will be omitted herein.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A stack package comprising:
    a first package including a first semiconductor chip and a first encapsulation member which seals the first semiconductor chip;
    a second package stacked on the first package, and including a second semiconductor chip and a second encapsulation member which seals the second semiconductor chip; and
    flexible conductors disposed in the first encapsulation member of the first package so as to electrically connect the first package and the second package,
    wherein each of the flexible conductors comprises a flexible circuit board having copper patterns formed on one surface thereof,
    wherein the configuration of the flexible conductors is one of rolled up in the shape of a hollow cylinder with the copper patterns disposed on an outer surface of the cylinder, or formed to have a sectional shape alternately curved in opposite directions.

2. The stack package according to claim 1, wherein the first encapsulation member has holes defined therein into which the respective flexible conductors are inserted.

3. The stack package according to claim 1, further comprising: first coupling members attached to a lower surface of the first package.

4. The stack package according to claim 1, further comprising:
    second coupling members attached to a lower surface of the second package and electrically connected with the flexible conductors.

5. The stack package according to claim 4, wherein the second coupling members comprise solder balls or additional flexible conductors.

6. A stack package comprising: a first package comprising:
    a first substrate having an upper surface on which first bond fingers and connection pads are disposed and having a lower surface on which first ball lands are disposed;
    a first semiconductor chip disposed on the upper surface of the first substrate and having first bonding pads which are electrically connected with the first bond fingers; and
    a first encapsulation member formed on the upper surface of the first substrate so as to seal the first semiconductor chip;
    a second package stacked on the first package, the second package comprising:
        a second substrate having an upper surface on which second bond fingers are disposed and a lower surface on which second ball lands are disposed;
        a second semiconductor chip disposed on the upper surface of the second substrate and having second bonding pads which are electrically connected with the second bond fingers; and
        a second encapsulation member formed on the upper surface of the second substrate so as to seal the second semiconductor chip; and
    flexible conductors disposed in the first encapsulation member of the first package so as to electrically connect the first package and the second package
    wherein each of the flexible conductors comprises a flexible circuit board formed with copper patterns on one surface thereof,
    wherein the configuration of the flexible conductors is one of rolled up in the shape of a hollow cylinder with the copper patterns disposed on an outer surface of the cylinder, or formed to have a sectional shape alternately curved in opposite directions.

7. The stack package according to claim 6, further comprising:
    first coupling members attached to the first ball lands.

8. The stack package according to claim 6, wherein one end of each flexible conductor is exposed out of the first encapsulation member and directly connected to the second ball lands.

9. The stack package according to claim 8, further comprising:
    second coupling members attached to the second ball lands and connected with the flexible conductors disposed in the first encapsulation member.

10. The stack package according to claim 9, wherein the second coupling members comprise solder balls or additional flexible conductors.

11. The stack package according to claim 7, wherein the first encapsulation member has holes defined therein, the holes respectively exposing the connection pads and into which the respective flexible conductors are inserted.

12. The stack package according to claim 11, further comprising:
    underfills formed in the holes of the first encapsulation member into which the flexible conductors are inserted.

13. A stack package comprising:
    a first package comprising:
        a first substrate having an upper surface on which first bond fingers and connection pads are disposed and having a lower surface on which first ball lands are disposed;
        a first semiconductor chip disposed on the upper surface of the first substrate and having first bonding pads which are electrically connected with the first bond fingers; and
        a first encapsulation member formed on the upper surface of the first substrate so as to seal the first semiconductor chip, wherein the first encapsulation member has holes defined therein, each of the holes simultaneously exposing a pair of adjoining connection pads and into which the respective flexible conductors are inserted;
    a second package stacked on the first package, the second package comprising:
        a second substrate having an upper surface on which second bond fingers are disposed and a lower surface on which second ball lands are disposed;

a second semiconductor chip disposed on the upper surface of the second substrate and having second bonding pads which are electrically connected with the second bond fingers; and a second encapsulation member formed on the upper surface of the second substrate so as to seal the second semiconductor chip; and flexible conductors disposed in the first encapsulation member of the first package so as to electrically connect the first package and the second package, wherein each of the flexible conductors comprises a flexible circuit board and copper patterns formed on one surface of the flexible circuit board, wherein the flexible circuit board is configured such that the copper patterns are disposed separately on both sidewalls of the holes and the copper patterns have a U-like sectional shape.

14. The stack package according to claim 13, further comprising:

underfills formed in the holes of the first encapsulation member into which the flexible conductors are inserted.

15. A stack package comprising:

a first package including a first semiconductor chip and a first encapsulation member which seals the first semiconductor chip;

one or more second packages stacked on the first package, each of the one or more second packages including second semiconductor chips and second encapsulation members which seal the second semiconductor chips; and flexible conductors respectively disposed in the first encapsulation member of the first package and disposed in each of the second encapsulation members of the second packages excluding an uppermost second package among the one or more stacked second packages, so as to electrically connect the first package and the second packages with each other, wherein each of the flexible conductors comprises a flexible circuit board having copper patterns formed on one surface thereof, wherein the configuration of the flexible conductors is one of rolled up in the shape of a hollow cylinder with the copper patterns disposed on an outer surface of the cylinder, or formed to have a sectional shape alternately curved in opposite directions.

16. The stack package according to claim 15, further comprising:

first coupling members attached to a lower surface of the first package; and second coupling members attached to lower surfaces of the second packages and electrically connected with the flexible conductors.

* * * * *